United States Patent [19]
Suzuki et al.

[11] Patent Number: 4,622,919
[45] Date of Patent: Nov. 18, 1986

[54] FILM FORMING APPARATUS
[75] Inventors: Yasuo Suzuki; Yasunori Ando, both of Otsu, Japan
[73] Assignee: Nissin Electric Co., Ltd., Kyoto, Japan
[21] Appl. No.: 653,685
[22] Filed: Sep. 21, 1984
[30] Foreign Application Priority Data
Dec. 29, 1983 [JP] Japan ............ 58-249803
[51] Int. Cl.⁴ ............ C23C 14/00
[52] U.S. Cl. ............ 118/718; 118/50.1; 118/719; 118/720; 118/723; 118/729
[58] Field of Search ............ 118/50.1, 718, 719, 118/720, 723, 729
[56] References Cited
U.S. PATENT DOCUMENTS
4,091,138  5/1978  Takagi ............ 427/81

Primary Examiner—Bernard D. Pianalto
Attorney, Agent, or Firm—Stiefel, Gross, Kurland & Pavane

[57] ABSTRACT

A process and an apparatus for forming films, up to several microns in thickness, on substrates by the combination of ion implantation and vapor deposition; said apparatus comprising a vacuum chamber, means for transporting a substrate within the vacuum chamber, a first ion source having an accelerating voltage of 500 V to 5 kV and disposed at a first position along the direction of movement of the substrate within the vacuum chamber, a first evaporator disposed at a second position along the direction of movement of the substrate within the vacuum chamber, and a second ion source having an accelerating voltage of 10 kV to 100 kV and disposed at a third position along the direction of movement of the substrate within the vacuum chamber, and optionally further comprising a second evaporator disposed at a fourth position along the direction of movement of the substrate within the vacuum chamber, which may be provided with high-frequency exciting means disposed in a path of release of vapor from the second evaporator toward the substrate for ionizing the vapor, and means for forming an electric field for accelerating the ionized vapor toward the substrate.

9 Claims, 8 Drawing Figures

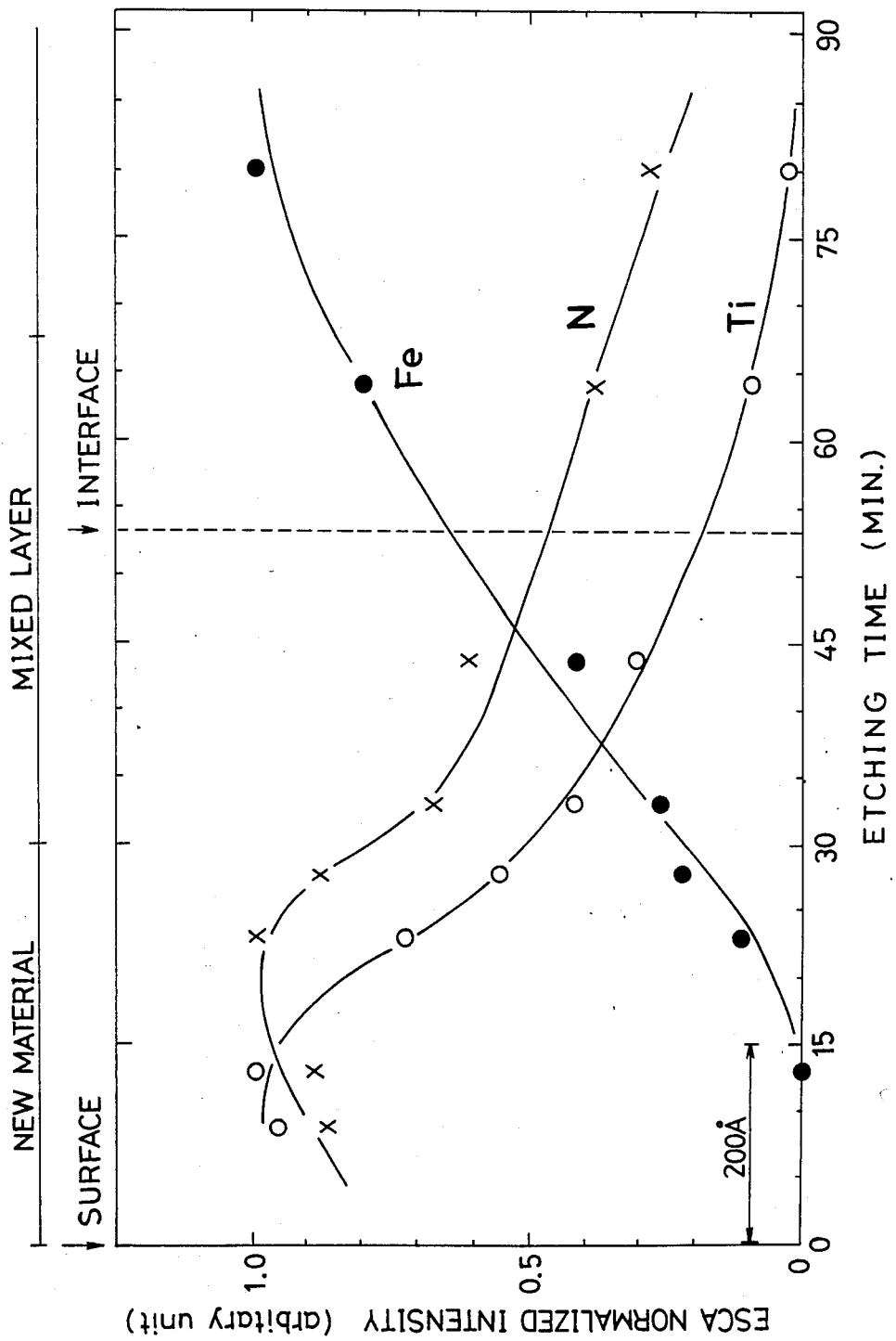

FILM FORMING APPARATUS

BACKGROUND OF THE INVENTION

1. Field of the Invention

The present invention relates to a process and an apparatus for forming films, up to several microns in thickness, on substrates by the combination of ion implantation and vapor deposition.

2. Description of the Prior Art

It is known to form a film on the surface of various substrates, such as steel plates, tools (drills, tips, bits, etc.) and rollers, to give higher corrosion resistance or improved hardness to the substrate.

Known film forming processes for this purpose include vacuum evaporation, sputtering and ion plating (U.S. Pat. No. 3,793,179).

The vacuum evaporation process is advantageous in forming films at a high velocity but has the drawback that the films formed have poor adhesion to the substrates. For example, when strip steel is coated with aluminum and thereafter subjected to press work or like process, the coating or film is likely to peel off.

The sputtering process has the serious drawback of forming films at a low velocity.

The ion plating process rapidly forms films which have stronger bonds with the substrates than those provided by the vacuum evaporation process, but the bond strength still remains to be fully improved.

On the other hand, the ion implantation process is known as a surface modifying technique although it is not a film forming process. By the ion implantation process, physical, chemical condition of near-surface layer can be modified to a depth of hundreds of angstroms to thousands of angstroms from the surface.

SUMMARY OF THE INVENTION

The present invention provides a process for forming a film of predetermined thickness on a substrate in a vacuum chamber comprising the steps of:

(i) activating the surface of the substrate by exposing the surface to ions at an accelerating voltage of 500 V to 5 kV, (ii) forming a base deposition layer on the activated substrate surface by vapor deposition, the base deposition layer having a thickness not larger than the depth to which ions can be implanted in the layer, and (iii) implanting ions in the deposition layer at an accelerating voltage of 10 kV to 100 kV;

the process, when required, further including (iv) subjecting, a desired number of times, the resulting deposition layer to (v) the step of vapor deposition or ion plating, and/or (vi) said steps (ii) and (iii), to form at least one layer over the deposition layer.

The process of the invention includes, for example, the combinations of steps (i), (ii) and (iii) only, steps (i), (ii), (iii) and (v), steps (i), (ii), (iii), (v) and (vi), steps (i), (ii), (iii), (v), (vi) and (v), etc. Thus, steps (v) and (vi) need not always be performed or may be performed alternately. Preferably step (v) is performed when the layer to be thereby formed has good adhesion to the preceding layer (for example when the two layers are of the same kind). It is desirable to perform step (vi) when the layer to be thereby formed has poor adhesion to the preceding layer (generally when the two layers are of different kinds). Steps (ii) and (iii) may be performed at the same time.

The present invention further provides a film forming apparatus comprising a vacuum chamber, means for transporting a substrate within the vacuum chamber, a first ion source having an accelerating voltage of 500 V to 5 kV and disposed at a first position along the direction of movement of the substrate within the vacuum chamber, a first evaporator disposed at a second position along the direction of movement of the substrate within the vacuum chamber, and a second ion source having an accelerating voltage of 10 kv to 100 kV and disposed at a third position along the direction of movement of the substrate within the vacuum chamber.

The present invention further provides a film forming apparatus comprising a vacuum chamber, means for transporting a substrate within the vacuum chamber, a first ion source having an accelerating voltage of 500 V to 5 kV and disposed at a first position along the direction of movement of the substrate within the vacuum chamber, a first evaporator disposed at a second position along the direction of movement of the substrate within the vacuum chamber, a second ion source having an accelerating voltage of 10 kV to 100 kv and disposed at a third position along the direction of movement of the substrate within the vacuum chamber, a second evaporator disposed at a fourth position along the direction of movement of the substrate within the vacuum chamber, high-frequency exciting means disposed in a path of release of vapor from the second evaporator toward the substrate for ionizing the vapor, and means for forming an electric field for accelerating the ionized vapor toward the substrate.

BRIEF DESCRIPTION OF THE DRAWINGS

FIG. 8 is a graph showing a depthwise ESCA chart of a film obtained according to the invention.

DESCRIPTION OF THE PREFERRED EMBODIMENTS

Figure 1:
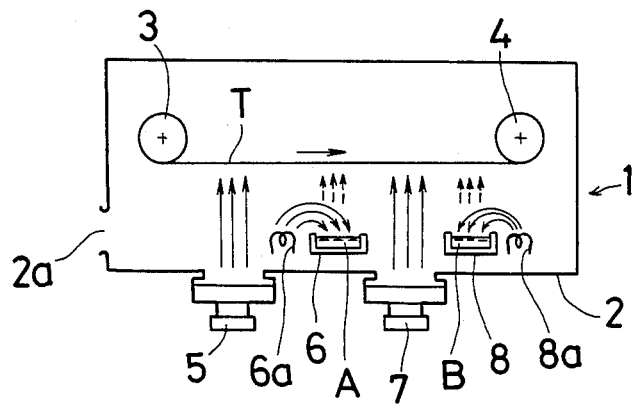
FIG. 1 is a diagram showing a film forming apparatus embodying the present invention.

FIG. 1 shows a film forming apparatus embodying the invention. A feed roll 3 and a take-up roll 4 (substrate transport means) are provided within a vacuum chamber 2. A tape-like substrate T is sent from the feed roll 3 to the take-up roll 4. A first ion source 5, a first evaporator 6, a second ion source 7 and a second evaporator 8 are arranged one after another along the direction of movement of the substrate T. Indicated at 2a is an evacuating opening in communication with a vacuum pump (not shown).

The first ion source 5 is adapted to accelerate ions of an inert element, such as Ar or Xe, at a voltage of 500 V to 5 kV to irradiate the substrate T with the ions, whereby the surface of the substrate is cleaned and activated.

The first evaporator 6 has an electron gun 6a for emitting an electron beam, by which a deposition material A is heated and evaporated to form a first deposition layer on the substrate T. The thickness of the first deposition layer to be formed by the first evaporator 6 is approximately equal to the mean range of ion from the second ion source or smaller. For example, when an Al deposition layer formed on a substrate of Fe is exposed to accelerated argon ions at 30 keV, the mean range of the argon ions within Al is about 30 nm, so that it is suitable for the initial Al deposition layer to have a thickness approximately equal to or smaller than this distance. Thus, it is preferable that the thickness be approximately equal to the mean range of ion. The thickness of the first deposition layer is limited by the kinds of the deposition material and ions and ion beam energy. For example, with use of ions of the same kind, the first deposition layer can be thicker when the energy is greater. Further at the same energy level, use of ions and/or deposition material of smaller mass gives a larger thickness to the first deposition layer. Furthermore, the mean range of ion increases with an decreases of the atomic number of the accelerated ion and decreases with an increase in the atomic number, as well as in the density, of the substrate. Accordingly the thickness of the initial deposition layer can be determined suitably in corresponding relation to the above-mentioned initial thickness setting, in the case of combinations of other materials.

The second ion source 7 accelerates ions of an element, such as Ar, Xe or N, at a voltage of 10 kV to 100 kV and implants the ions in the deposition layer. Owing to a knock-on phenomenon between the implanted ions and ions constituting the deposition layer or the substrate, atoms of the substrate and those of the deposition layer become mixed at the interface between the substrate and the deposition layer, forming a continuously varying composition (mixed layer) in the vicinity of the interface. Consequently the deposition layer is bonded to the surface of the substrate with high strength.

The second evaporator 8 has the same construction as the first evaporator 6 and evaporates a material B. When the material B is the same as the deposition material A, a deposition layer of the same material as the preceding deposition layer is subsequently formed, with the substrate held in the same vacuum, so that the layers are substantially equivalent to an integral deposition layer. Thus no problem arises as to adhesion or bond strength. Consequently a film of predetermined thickness can be formed on the surface of the substrate when the second layer is formed to the desired thickness by vapor deposition. The film has a very strong bond with the substrate surface. On the other hand, if the deposition material B differs from the material A but has good adhesion to the material A, a second layer of desired thickness may be formed by vapor deposition as when the two materials are the same. However, when the material B has poor adhesion to the material A (as is the case with different materials), a vapor deposition layer is formed with a thickness approximately equal to or smaller than the average sputtering distance of ions in the same manner as when the first deposition layer is formed. Subsequently the feed roll 3 and the take-up roll 4 are reversely rotated to reversely transport the substate T to implant ions in the layer by the second ion source 7 and give enhanced bond strength.

When it is desired to avoid reverse transport of the substrate T from the viewpoint of continuous operation, a third ion source may be provided subsequent to the second evaporator 8. Similarly additional evaporators and ion sources may be provided along the path of movement of the substrate when so desired.

Figure 2:
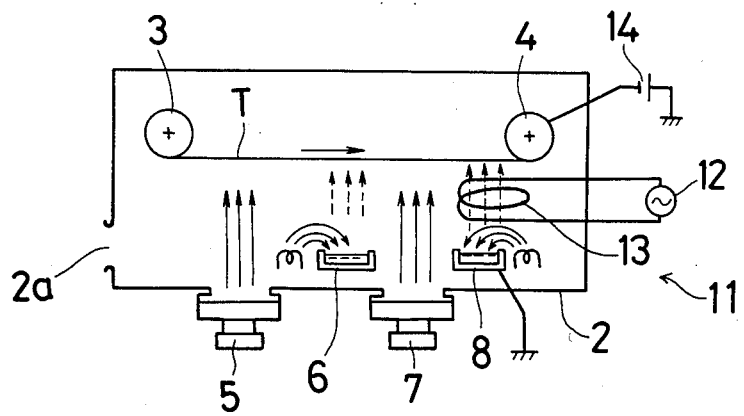
FIG. 2 is a diagram showing another embodiment.

FIG. 2 shows another embodiment 11 of film forming apparatus of the present invention. Components 2 to 8 each have the same construction as the corresponding components of the foregoing apparatus 1 referred to by like reference numerals. The apparatus 11 of FIG. 2 is characterized by a high-frequency power supply 12 and a high-frequency coil 13 for ionizing the deposition material vaporized by the second evaporator 8, and a bias voltage source 14 for accelerating the ionized vapor to deposit the vapor on the substrate T for ion plating.

Figure 3:
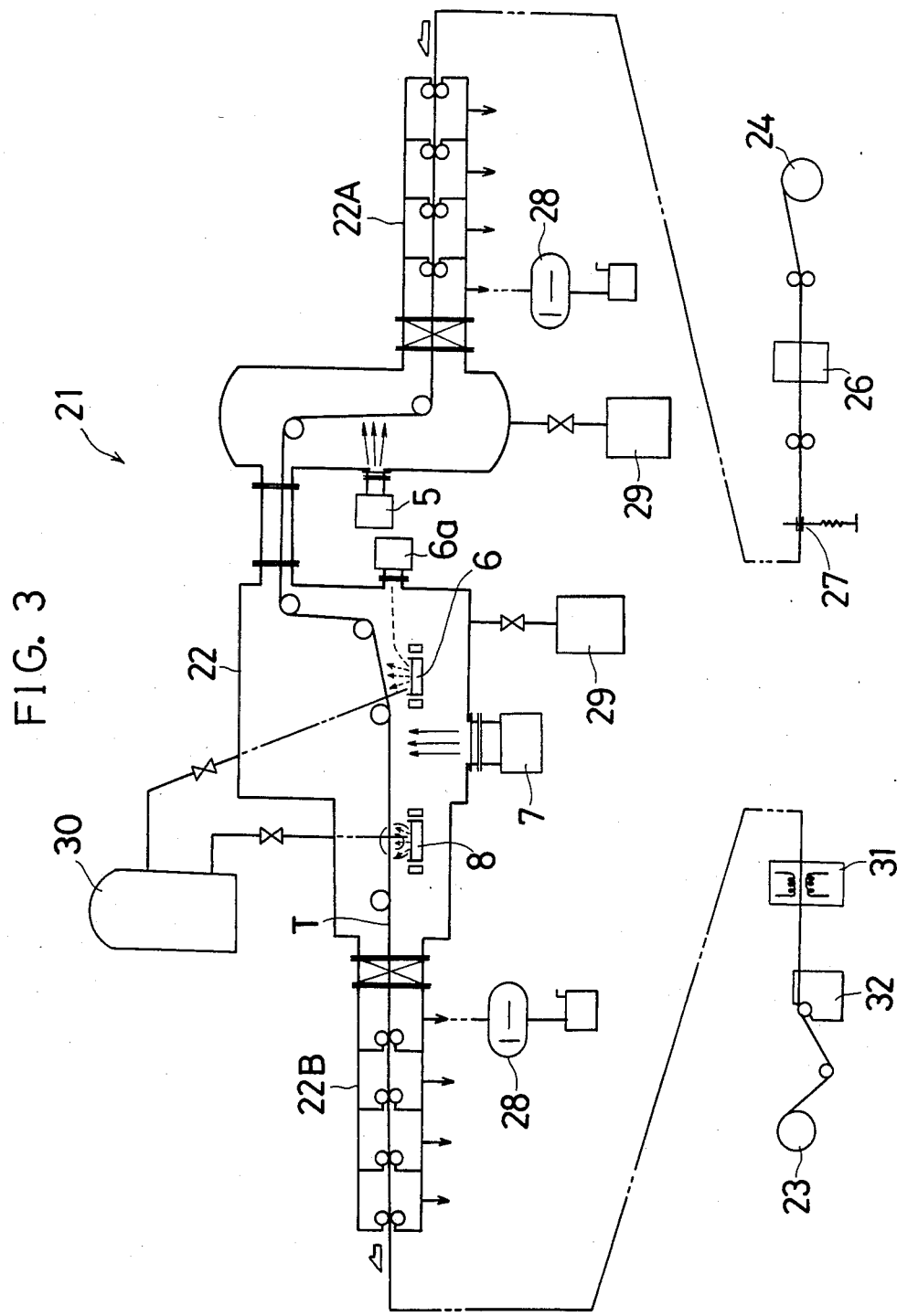
FIG. 3 is a diagram showing another embodiment.

FIG. 3 shows still another embodiment 21 of film forming apparatus of the present invention. The apparatus 21 has a feed roll 24 and a take-up roll 23 which are provided outside a vacuum chamber 22. A tape-like substrate T is fed to the vacuum chamber 22 through an inlet portion 22A attached to the chamber 22 and is sent out from an outlet portion 22B. Components 5 to 8 each have the same construction as the corresponding components of the apparatus 1 of FIG. 1 referred to by like reference numerals. FIG. 3 further shows a welder 26, a band braker 27, mechanical vacuum pumps 28, diffusion vacuum pumps 29, a deposition material feeder 30, a thickness gauge 31 and a control roll 32. Since the feed roll 24 and the take-up roll 23 are disposed outside the vacuum chamber 22, the rear end of one substrate T can be connected to the front end of another substate T. Thus rolls of substrate can be treated continuously with a vacuum maintained in the chamber 22.

Production examples are given below.

PRODUCTION EXAMPLE 1

A strip steel T, 0.5 mm in thickness and 300 mm in width, was degreased with trichloroethylene and acetone for pretreatment. An Al film was formed on one surface of the strip with use of the apparatus of FIG. 1.

The strip steel T, while being moved at a speed of 1 to 15 m/min, was exposed by the first ion source 5 to Ar ions accelerated at a voltage of 500 V to 5 kV to clean and activate the film forming surface. The strip was irradiated at a dose of $5 \times 10^{15}$ to $5 \times 10^{16}$ ions/cm$^2$.

Next, an Al film was formed on the substrate by the first evaporator 6 to a thickness of about 400 angstroms (about 40 nm). The thickness of the Al film was so determined as to approximately match the mean range of Ar ions in Al at an accelerating voltage of 40 kV, as calculated based on the LSS theory (Lindhard-Scharff-Schiøtt theory) which is well known on the field of ion implantation technique.

The film was then exposed by the second ion source 7 to Ar ions accelerated at a voltage of 40 kV, at a dose of $1 \times 10^{16}$ to $1 \times 10^{17}$ ions/cm$^2$.

Finally the Al film was formed to a thickness of 1 μm by the second evaporator 8.

The 1-μm-thick Al film thus formed on the strip steel had high bond strength. The catalytic action of Ar ions promoted crystallization of the deposited film.

During the film forming operation, the vacuum chamber 2 was maintained at a vacuum of $10^{-4}$ to $10^{-5}$ torr with use of an oil rotary pump and oil diffusion pump. A 30-kW electron gun 6a was used for the first evaporator 6, and an 80-kW electron gun 8a for the second evaporator 8.

PRODUCTION EXAMPLE 2

A strip steel T, 0.5 mm in thickness and 300 mm in width, was degreased with trichloroethylene and acetone for pretreatment and then coated with TiN on one surface thereof with use of the apparatus of FIG. 1.

The strip steel T, while being moved at a speed of 1 to 15 m/min, was exposed by the first ion source 5 to Ar ions accelerated at a voltage of 500 V to 5 kV, at a dose of $5 \times 10^{15}$ to $5 \times 10^{16}$ ions/cm$^2$, whereby the film forming surface was cleaned and activated.

Next, a Ti film was formed on the substrate by the first evaporator 6 to a thickness of about 800 angstroms (about 80 nm). The thickness of the Ti film was so determined as to approximately match the mean range of nitrogen ions in Ti at an accelerating voltage of 40 kV, as calculated based on the LSS theory.

The film was then exposed by the second ion source 7 to nitrogen ions accelerated at a voltage of 40 kV, at a dose of about $5 \times 10^{17}$ ions/cm$^2$.

Finally a film of TiN having a thickness of 1 μm was formed by the second evaporator 8.

The 1-μm-thick TiN film thus formed on the steel strip had high bond strength.

During the film forming operation, the vacuum chamber 2 was evacuated by an oil rotary pump and oil diffusion pump to maintain a vacuum of $10^{-4}$ to $10^{-5}$ torr. A 30-kW electron gun 6a was used for the first evaporator 6, and an 80-kW electron gun 8a for the second evaporator 8.

PRODUCTION EXAMPLE 3

A strip steel T, 0.5 mm in thickness and 300 mm in width, was degreased with trichloroethylene and acetone for pretreatment and then coated with TiN on one surface thereof with use of the apparatus of FIG. 2.

First, the vacuum chamber 2 was evacuated to a vacuum of the order of $10^{-6}$ torr, and nitrogen gas having a purity of at least 99.999% was introduced into the chamber to maintain a vacuum of the order of $10^{-4}$ torr.

The steel strip T, while being moved at a speed of 10 to 50 cm/min, was exposed by the first ion source 5 to Ar ions accelerated at a voltage of 500 V to 5 kV, at a dose of $5 \times 10^{15}$ to $5 \times 10^{16}$ ions/cm$^2$, whereby the film forming surface was cleaned and activated.

Next, a Ti film was formed on the substrate by the first evaporator 6, having a 10-kW electron gun for heating, to a thickness of 600 to 650 angstroms (60 to 65 nm). The thickness of the Ti film was so determined as to approximately match the mean range of nitrogen ions in Ti at an accelerating voltage of 30 kV.

The film was then exposed by the second ion source 7 to nitrogen ions accelerated at a voltage of 30 kV, at a dose of $7 \times 10^{16}$ to $3 \times 10^{17}$ ions/cm$^2$.

When Ti was thereafter evaporated by the second evaporator 8 having a 30-kW electron gun for heating, a high frequency of 13.56 MHz was applied to the high-frequency coil 13 at 500 W to 1 kW from the power supply 12 to cause a discharge, with a voltage of 500 V to 1 kV applied to the substrate from the bias voltage source 14.

With the implantation of nitrogen ions, the Ti film formed by the first evaporator 6 became a Ti-N film as strongly bonded to the steel strip T. The Ti vapor formed by the second evaporator 8 was ionized by the discharge in the presence of nitrogen gas, forming a Ti-N film over the preceding Ti-N film. Thus, the Ti-N film was formed on the steel strip T with high bond strength.

EXAMPLE 1

Figure 4:
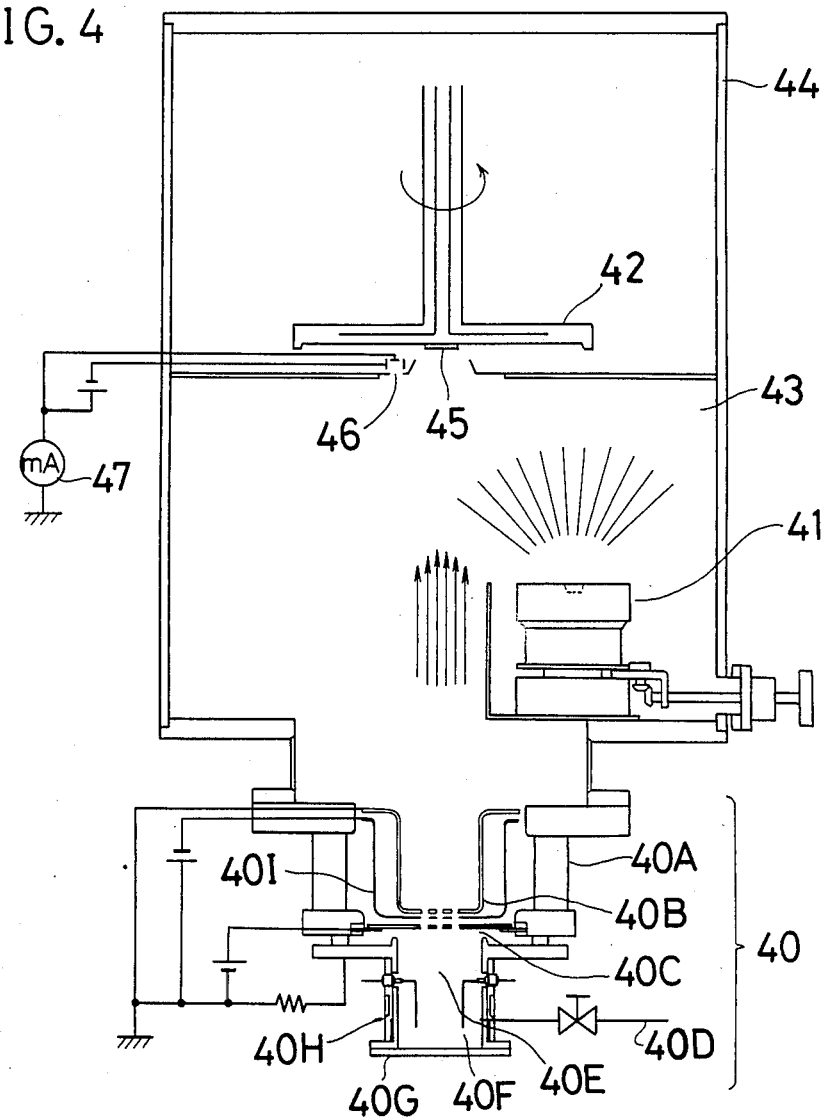
FIG. 4 is a diagram showing an embodiment of apparatus for practicing the process of the invention.

FIG. 4 is a schematic diagram showing another apparatus for practicing the film forming process of the invention.

The apparatus consists mainly of a rectangular bucket type multi-aperture ion source 40, an evaporator 41 with an electron beam gun, a rotary specimen holder 42, a film thickness monitor 43 and a vacuum chamber 44. FIG. 4 further shows a substrate (specimen) 45, a faraday cup 46, an ion beam current monitor 47, an insulator 40A, an ext. grid 40B, a plasma grid 40C, a gas inlet 40D, an arc chamber 40E, a filament 40F, a backstream electron beam dumper 40G, a magnet 40H and a suppressor grid 40I.

As ion species, nitrogen, carbon, etc. and as materials to be evaporated, boron, aluminum, titanium, silicon, etc. can be provided. The temperature of substrates is controlled by water-cooling the interior of the specimen holder and heater plate attached to the holder.

The performance obtained is as follows.

(1) Ion beam energy: 2–40 keV
(2) Ion beam current: 100 mA for nitrogen ion
(3) Beam intensity distribution: less than 10% within $4 \times 10$ cm area at targe
(4) Electron beam power: 5 kW
(5) Base pressure: of the order of $10^{-5}$ Pa
(6) Holder temperture: R.T.$-300°$ C.

(Pretreatment)

The substrates used were low-carbon steel plates mechanically mirror-polished by buffing wheel. After ultrasonic cleaning with trichloroethylene and acetone, the substrates were sputtered by a 10-keV argon ion beam for cleaning the surface.

(Preparation of Specimens)

After a thin aluminum film with a thickness of 300 angstroms was formed on the steel substrate by vapor deposition at room temperature and about $1 \times 10^{-3}$ Pa, argon ion implantation was carried out with a dose of $1 \times 10^{16}$ or $1 \times 10^{17}$ ions/cm$^2$ at the energy of 30 keV. A mixed layer was formed between the steel substrate and the thin film. Aluminum was further deposited on the film to a thickness of 1 μm.

(Mechanical Properties of Specimens)

Figure 5:
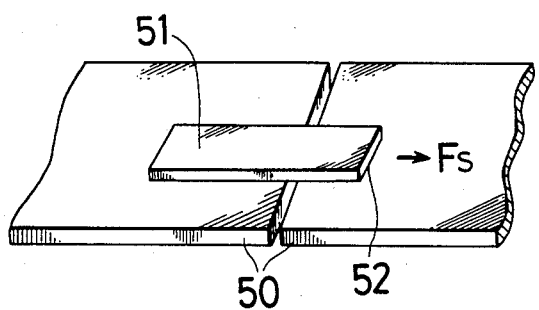
FIG. 5 is a diagram showing an arrangement for tensile strength test conducted in Example 1.

As shown in FIG. 5, each aluminum-coated substrate 51, $10 \times 50 \times 3.2$ mm in dimensions, was bonded to two aluminum plates 50 by an epoxy resin adhesive 52. Effective area of the sample test was 1 cm$^2$. Tensile strength test was carried out by pulling the aluminum plates 50.

Figure 6:
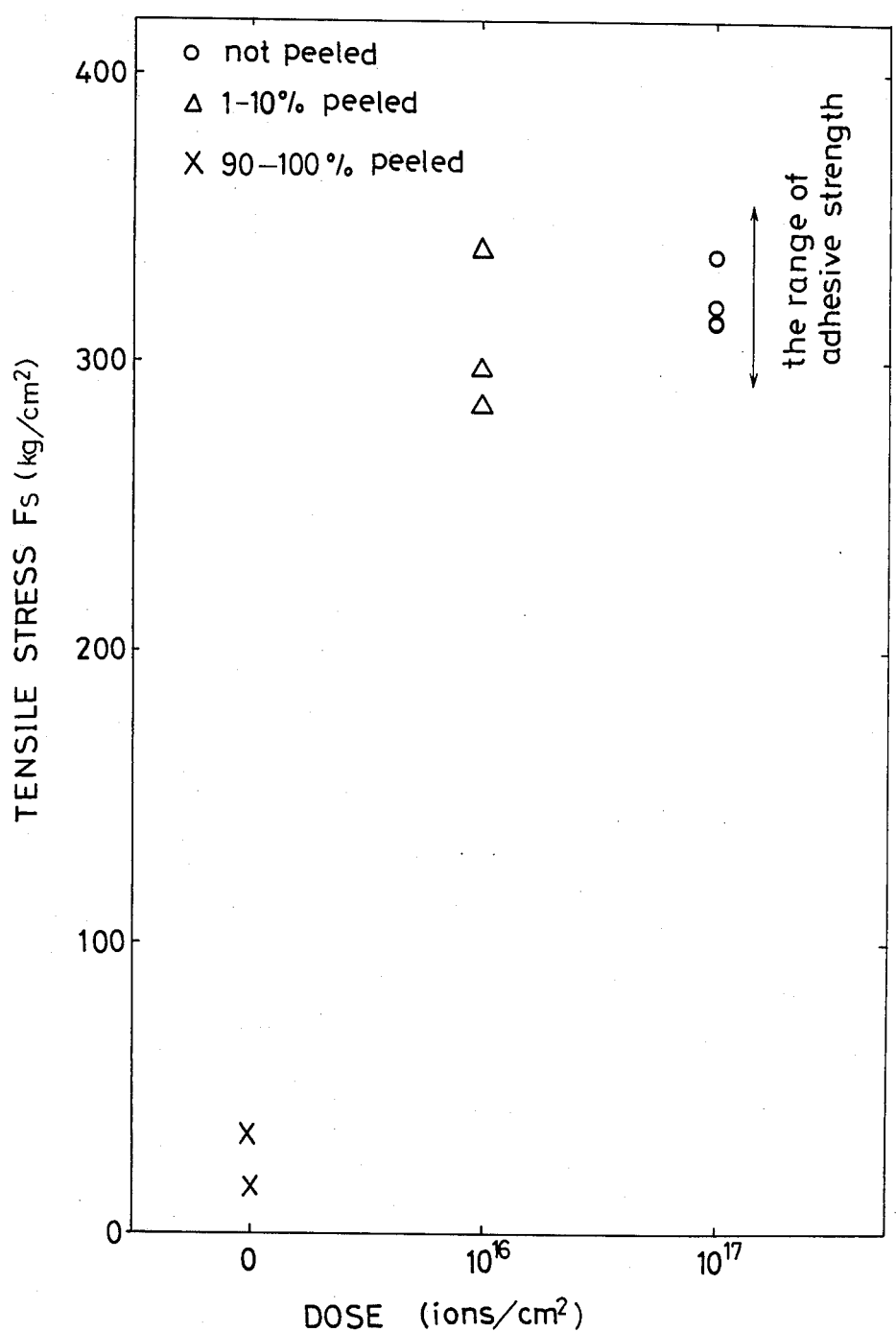
FIG. 6 is a graph showing the relationship between the dose of argon ions and the tensile stress.

FIG. 6 shows the relationship between the dose of argon ions and the tensile stress. In the case of comparative specimens prepared by coating steel substrates with aluminum only by vapor deposition at 200° C. without ion implantation, the thin aluminum film peeled off from the substrate only at a tensile stress of 20–30 kg/cm$^2$. The peeling tensile stress for ion-implanted aluminum-coated substrate was 280–340 kg/cm$^2$ in the case of the dose of $1 \times 10^{16}$ ions/cm$^2$, and only several percent of the aluminum film peeled off partially. In the case of the dose of $1 \times 10^{17}$ ions/cm$^2$, the adhesive bond formed broke before the aluminum film peeled off. The maximum tensile stress of the adhesive bond was in the range of 280–340 kg/cm$^2$.

Figure 7:
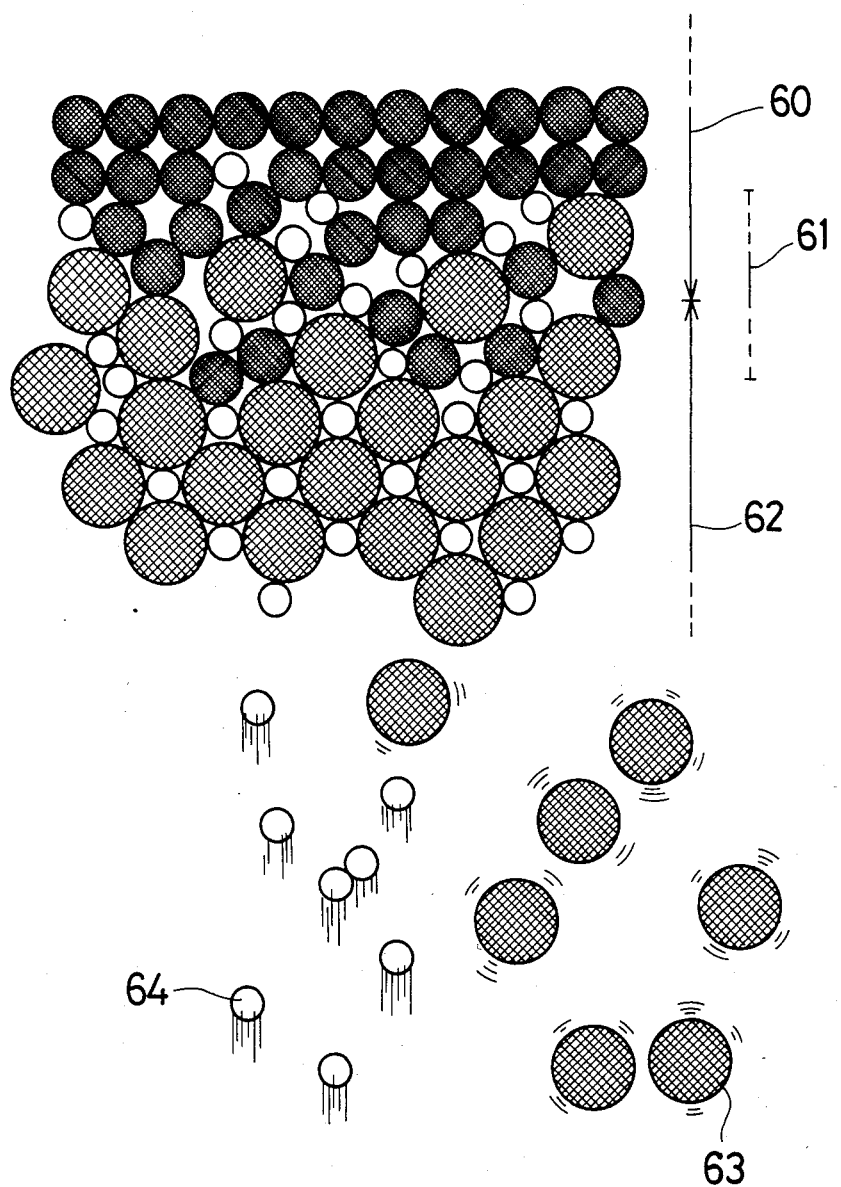
FIG. 7 is an image diagram showing the structure of a film formed according to the invention.

The increase of tensile strength is due to the mixed layer which is formed in the thin film-substrate interface by ion implantation as shown in FIG. 7. The mixed layer 61 is produced by direct implantation, recoil implantation at the surface of the substrate 60, and knock-on to the substrate of the vapor material. FIG. 7 shows a newly-formed material 62, a vapor 63 such as Ti, Al, Cr or the like, and an ion beam 64 as of N, C, H or the like.

EXAMPLE 2

A coating layer (TiN) having a thickness of 700 angstroms was formed on a stainless steel substrate in the same manner as in Example 1 by conducting ion implantation and vapor deposition at the same time with use of Ti and N in the ratio of 1:1. The surface was analyzed by ESCA to determine the depthwise distribution of elements. FIG. 8, showing the result, indicates that a mixed layer is formed over a thickness of 500 angstroms, with nitrogen and titanium ions incorporated into the substrate by implantation and knock-on. Fe which is the main component of the stainless steel is sputtered in the coating layer. Over the thickness of 400 angstroms from the surface, TiN, a new material, forms a surface layer.

As described above, the film forming process and apparatus of the present invention has the advantage of forming films at as high a velocity as the conventional vacuum evaporation process and giving a very strong bond between the film and the substrate surface.

As many apparently widely different embodiments of this invention may be made without departing from the spirit and scope thereof, it is to be understood that the invention is not limited to the specific embodiments thereof except as defined in the appended claims.

What we claim is:

1. A film forming apparatus comprising a vacuum chamber, means for transporting a substrate within the vacuum chamber, a first ion source having an accelerating voltage of 500 V to 5 kV and disposed at a first position along the direction of movement of the substrate within the vacuum chamber, a first evaporator disposed at a second position along the direction of movement of the substrate within the vacuum chamber, and a second ion source having an accelerating voltage of 10 kv to 100 kV and disposed at a third position along the direction of movement of the substrate within the vacuum chamber.

2. A film forming apparatus as defined in claim 1 wherein a second evaporator is disposed at a fourth position along the direction of movement of the substrate within the vacuum chamber.

3. An apparatus as defined in claim 1 wherein the substrate transporting means comprises a feed roll and a take-up roll for transporting a tape-like substrate.

4. An apparatus as defined in claim 3 wherein the feed roll and the take-up roll are both disposed within the vacuum chamber.

5. An apparatus as defined in claim 3 wherein the feed roll and the take-up roll are both disposed outside the vacuum chamber, and the vacuum chamber is provided with an inlet portion and an outlet portion for the tape-like substrate.

6. A film forming apparatus comprising a vacuum chamber, means for transporting a substrate within the vacuum chamber, a first ion source having an accelerating voltage of 500 V to 5 kV and disposed at a first position along the direction of movement of the substrate within the vacuum chamber, a first evaporator disposed at a second position along the direction of movement of the substrate within the vacuum chamber, a second ion source having an accelerating voltage of 10 kV to 100 kV and disposed at a third position along the direction of movement of the substrate within the vacuum chamber, a second evaporator disposed at a fourth position along the direction of movement of the substrate within the vacuum chamber, high-frequency exciting means disposed in a path of release of vapor from the second evaporator toward the substrate for ionizing the vapor, and means for forming an electric field for accelerating the ionized vapor toward the substrate.

7. An apparatus as defined in claim 6 wherein the substrate transporting means comprises a feed roll and a take-up roll for transporting a tape-like substrate.

8. An apparatus as defined in claim 7 wherein the feed roll and the take-up roll are both disposed within the vacuum chamber.

9. An apparatus as defined in claim 7 wherein the feed roll and the take-up roll are both disposed outside the vacuum chamber, and the vacuum chamber is provided with an inlet portion and an outlet portion for the tape-like substrate.

* * * * *

UNITED STATES PATENT AND TRADEMARK OFFICE
CERTIFICATE OF CORRECTION

PATENT NO. : 4,622,919

DATED : November 18, 1986

INVENTOR(S) : Yasuo Suzuki et al.

It is certified that error appears in the above-identified patent and that said Letters Patent is hereby corrected as shown below:

Column 3, line 22: "increases" should read --decreases--.

Column 3, line 22: "decreases" should read --increase--.

Signed and Sealed this

Twenty-second Day of March, 1988

Attest:

DONALD J. QUIGG

Attesting Officer     Commissioner of Patents and Trademarks